US012787211B2

(12) United States Patent
Stein et al.

(10) Patent No.: US 12,787,211 B2
(45) Date of Patent: Nov. 3, 2026

(54) AUTOMATION DEVICE WITH HEAT SINK

(71) Applicant: Siemens Aktiengesellschaft, Munich (DE)

(72) Inventors: Ulf Stein, Schwandorf (DE); Martin Bergmann, Schnaittenbach (DE)

(73) Assignee: Siemens Aktiengesellschaft, Munich (DE)

( * ) Notice: Subject to any disclaimer, the term of this patent is extended or adjusted under 35 U.S.C. 154(b) by 253 days.

(21) Appl. No.: 18/795,547

(22) Filed: Aug. 6, 2024

(65) Prior Publication Data

US 2025/0056754 A1 Feb. 13, 2025

(30) Foreign Application Priority Data

Aug. 7, 2023 (EP) .................................... 23189941

(51) Int. Cl.
*H05K 7/20* (2006.01)
*F28D 21/00* (2006.01)

(52) U.S. Cl.
CPC . *H05K 7/20127* (2013.01); *F28D 2021/0029* (2013.01)

(58) Field of Classification Search
CPC . H05K 7/20127–20163; H05K 7/1462; H05K 7/20336; H05K 1/0203; F28D 2021/0029; F28D 15/0275
See application file for complete search history.

(56) References Cited

U.S. PATENT DOCUMENTS

2005/0224214 A1 10/2005 Zeighami et al.
2008/0117593 A1* 5/2008 Andric ................ H05K 7/1092 257/E23.099
2009/0279256 A1 11/2009 Peng et al.
2011/0073283 A1 3/2011 Huang
2012/0181866 A1 7/2012 Abert et al.
2014/0146478 A1 5/2014 Baeuml et al.
2016/0105998 A1* 4/2016 Lodholz ............ H05K 7/20509 361/698
2016/0178282 A1* 6/2016 Bergmann ............ F28D 7/0066 165/169
2022/0346274 A1 10/2022 Lin

FOREIGN PATENT DOCUMENTS

DE 202009004656 U1 6/2009
EP 2479861 A1 7/2012
EP 2736311 B1 8/2017

* cited by examiner

*Primary Examiner* — Jacob R Crum
(74) *Attorney, Agent, or Firm* — Cozen O'Connor

(57) ABSTRACT

An automation device configured for use in an automation environment for automation of an industrial process includes an enclosure and a printed circuit board arranged parallel to first and second side parts at right angles to an upper or underside of the enclosure, wherein the printed circuit board carries a microprocessor in thermal connection with a heat sink that has cooling metal sheets, where the heat sink has a plurality of cooling metal sheets each arranged parallel to the printed circuit board with a clearance between them such that, for a first installation position in which the underside is aligned horizontally, a cooling medium flows from the underside through clearances, and where openings are each arranged in the cooling metal sheets such that, for a second installation position in which the underside is aligned vertically, the cooling medium flows through the openings arranged one above the other.

9 Claims, 15 Drawing Sheets

AUTOMATION DEVICE WITH HEAT SINK

BACKGROUND OF THE INVENTION

1. Field of the Invention

The invention relates to an automation device configured for use in an automation environment for automation of an industrial process, which has a basic enclosure comprising a rear side, an upper side, an underside, a first side part and a second side part which together are formed in a box shape, where the rear side is structured for mounting on a mount, a printed circuit board is arranged parallel to the first side part and the second side part at right angles to the upper side or the underside, and where the printed circuit board carries a microprocessor that is in thermal connection with a heat sink that has cooling metal sheets.

2. Description of the Related Art

EP 2 736 311 B1 discloses an automation device, which has a basic enclosure, a front hood and a primary heat sink for dissipating heat from a microprocessor.

The miniaturization of electronic components has resulted in increasing implementation of a higher packing/functional density of electronic components/parts on a flat module, such as a populated printed circuit board. This leads to increased power loss, in particular in the case of microprocessors, because the performance of microprocessors is increasing and with it the heat loss. For example, the use of modern microprocessors, such as those used for the personal computer sector, in an automation device is leading to an enormous increase in the power loss in the automation device.

To date, processors with a lower power density have been installed in conventional CPUs throughout the industrial sector. Therefore, to date, heat sinks made of die-cast or extruded parts have been sufficient as the “state of the art”. Due to the significantly higher power density of new generation processors, because of its lower cooling capacity, a heat sink of this kind would not be sufficient for the ambient conditions required in industry, such as temperatures of up to 60° C., the use of convection cooling only, but no active fans, vibratory and shock loads and very long continuous operation of up to 10 years. Therefore, in future, it will be necessary to use a new much more powerful cooling system in this sector. Furthermore, sufficient cooling will have to be guaranteed regardless of the installation position.

SUMMARY OF THE INVENTION

It is an object of the present invention to provide an improved cooling concept for automation devices that ensures sufficient cooling regardless of the installation position.

This and other objects and advantages are achieved in accordance with the invention by an automation device in which a heat sink has a plurality of cooling metal sheets that are each arranged parallel to the printed circuit board with a clearance between them and hence, for a first installation position in which the underside is aligned horizontally, it is possible for a cooling medium to flow from the underside through the clearances, where openings are arranged in each of the cooling metal sheets and hence, for a second installation position in which the underside is aligned vertically, it is possible for the cooling medium to flow through the openings arranged one above the other in the second installation position.

The openings introduced in the cooling metal sheets act like a chimney within a heat sink package. Heated air can easily flow out in accordance with the Bernoulli effect. The rear side is structured for mounting on a mount, such as a control panel or on a standard top-hat rail. A common first installation position is a horizontal installation position, but in some cases, a second installation position, i.e., an installation position rotated by 90° C. to the first installation position, may be necessary due to a lack of space.

For example, the temperature range for automation modules is set at 0° C. to +60° C., but in the case of a vertical installation position, 40° C. should not be exceeded.

The cooling capacity is further optimized if the openings in the cooling metal sheet are bent out of the cooling metal sheet as vanes. The openings result in an even more uniform laminar flow, in particular when the vanes are folded upward. This effect has a further positive impact on the efficiency of any heat pipe used in vertical cases. Furthermore, these vanes have the advantage that the total surface area of the cooling metal sheets is almost identical to the total surface area of a package with cooling metal sheets without these openings. A positive consequence of this is that the cooling performance remains almost constant when using a heat pipe, even when installed horizontally.

If a heat pipe is used, then the heat sink comprises a cooling plate that is arranged on the microprocessor, a pipe is embedded in the cooling plate such that a first pipe section protrudes vertically from the cooling plate, a second pipe section is at least partially embedded in the cooling plate and a third pipe section in turn protrudes vertically from the cooling plate, where the cooling metal sheets are each arranged on the first pipe section and on the third pipe section parallel to the printed circuit board with a clearance between them.

The cooling capacity is further improved if a first pipe and a second pipe are embedded in the cooling plate such that a first pipe section of the first pipe protrudes vertically from the cooling plate, a second pipe section of the first pipe is at least partially embedded in the cooling plate and a third pipe section of the first pipe in turn protrudes vertically from the cooling plate and that a first pipe section protrudes from the second pipe vertically from the cooling plate, a second pipe section of the second pipe is at least partially embedded in the cooling plate and a third pipe section of the second pipe in turn protrudes vertically from the cooling plate, where the cooling metal sheets are each arranged on the first pipe section and on the third pipe section of the respective first and second pipes parallel to the printed circuit board with a clearance between them.

For example, two copper pipes, so-called “heat pipes”, can be pressed, glued or soldered into the cooling plate, which acts as a heat spreader. The cooling metal sheets, made, for example, of aluminum, can also be pressed, glued or soldered onto the heat pipes.

To ensure that contact between the microprocessor to be cooled and the cooling plate is not lost, even when the automation device is exposed to a vibration load, the cooling plate is surrounded by a base support, a cover is arranged on the base support and the printed circuit board is arranged between the base support and the cover, where a spring-mounted pressing structure is arranged between the cover and the printed circuit board.

In order to obtain a stable arrangement of a cooling package, the cooling metal sheets are formed as sheet metal stampings and connecting tabs are arranged in the edge region, where a connecting tab comprises a support part, a first limb and a second limb, and the first limb and the second limb are arranged at the edge of the cooling metal sheet, where the first and second limb are combined to form the support part, a recess is stamped out between the first limb and the second limb such that a pin is arranged on the edge, and where a pin bearing is additionally arranged through the recess at the connection point of the first and second limb to the support part. The connecting tabs are angled at 90 degrees to the surface normal of the cooling metal sheet, making it possible to form a package of cooling metal sheets. The cooling plates can now be stacked and are clamped or latched with one another.

For the purposes of the invention, a heat pipe, i.e., the pipes used, should be understood to mean a cooling system that cools a microprocessor in the form of a closed system in heat pipes. Most heat pipes work according to a simple scheme: the thin-walled heat pipe has a special capillary structure on the inside and is made of a highly thermally conductive material. It contains a small amount of vaporizable liquid. According to the principle of pipe cooling, a heat pipe absorbs higher temperatures and transports them to a place where it can dissipate the heat.

Inside the heat pipe, there is a negative pressure and some liquid. This absorbs the heat, heats up and travels in vapor form to the other end of the heat pipe. Herein, due to the low temperature at this location, it cools down and hence condenses. This releases the heat, where the liquid cools down again. The liquid then flows back to its original location for heat absorption and prepares for a new round.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment of the invention, in which.

DETAILED DESCRIPTION OF THE EXEMPLARY EMBODIMENTS

Figure 1:
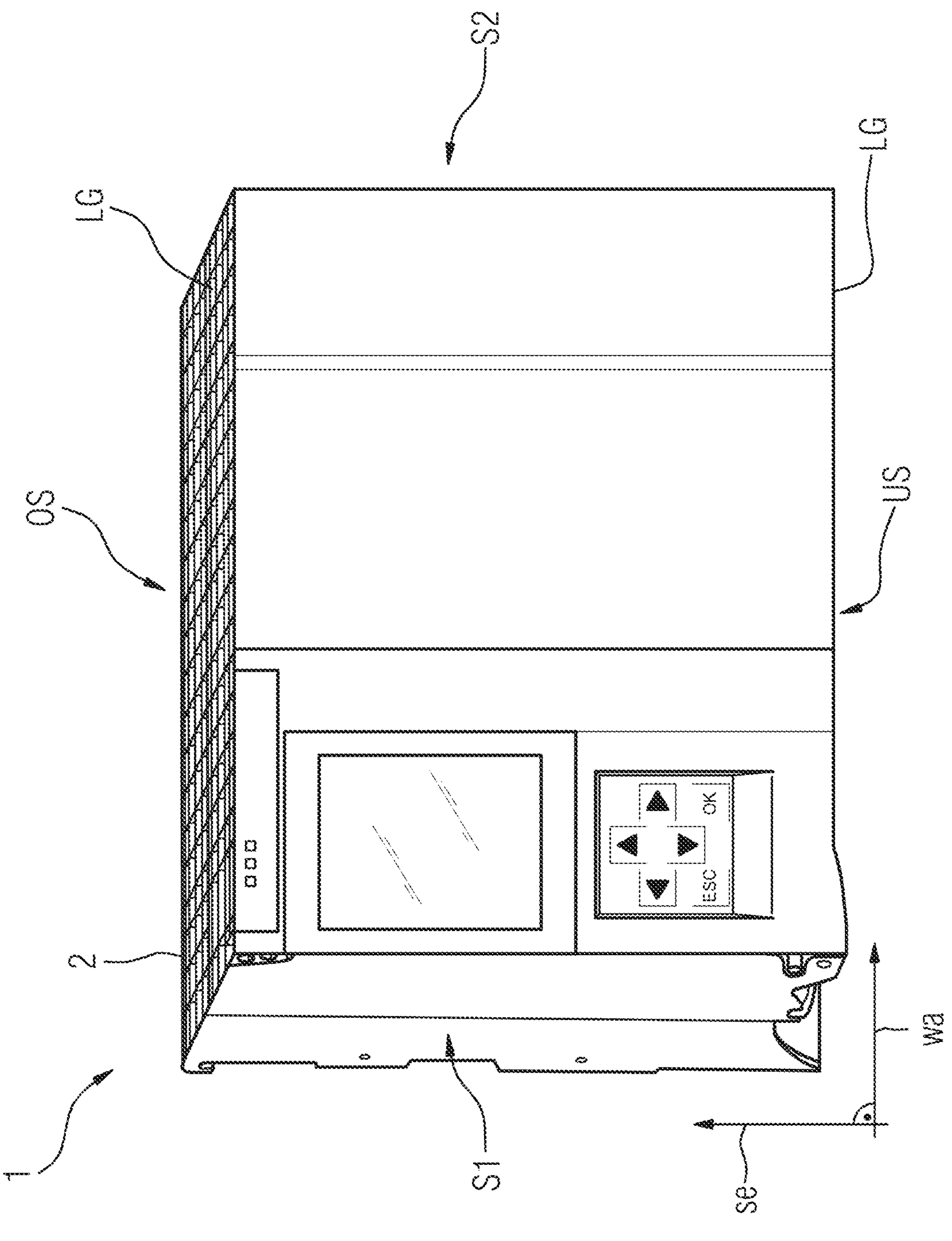
FIG. 1 is an illustration of an automation device in a three-dimensional view in accordance with the invention.

FIG. 1 shows an automation device 1 for use in an automation environment for automation of an industrial process.

The automation device 1 has a basic enclosure 2 comprising a rear side RS, an upper side OS, an underside US, a first side part S1 and a second side part S2. This provides the automation device 1 with a box shape in which the components, such as electronic circuits, printed circuit board, cooling elements and/or connections, located inside are arranged. The automation device 1 has ventilation grilles LG on the upper side OS and the underside US. For a standard installation position, the automation device 1 is aligned horizontally WA. This means that the side parts S1, S2 are aligned vertically. In terms of its cooling principle, the automation device 1 is structured for convection cooling, which means that air can flow from the underside US, cool the module and then in turn exit at the upper side OS via the ventilation grille LG.

Figure 2:
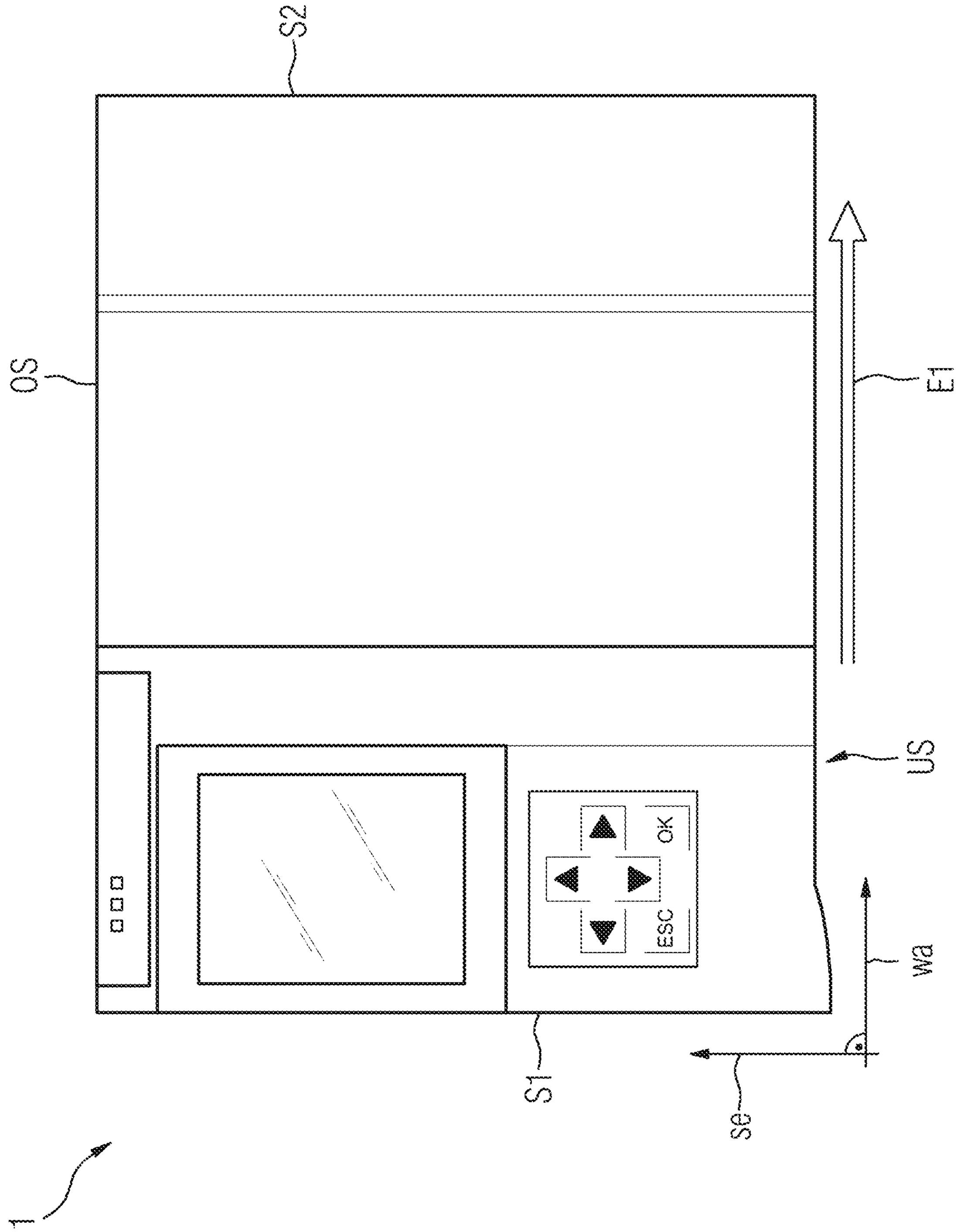
FIG. 2 is an illustration of a front, side view of the automation device of FIG. 1.

FIG. 2 shows the automation device 1 in a first installation position E1. The first installation position E1 is a preferred installation position for the automation device 1. The underside US is aligned horizontally WA.

Figure 3:
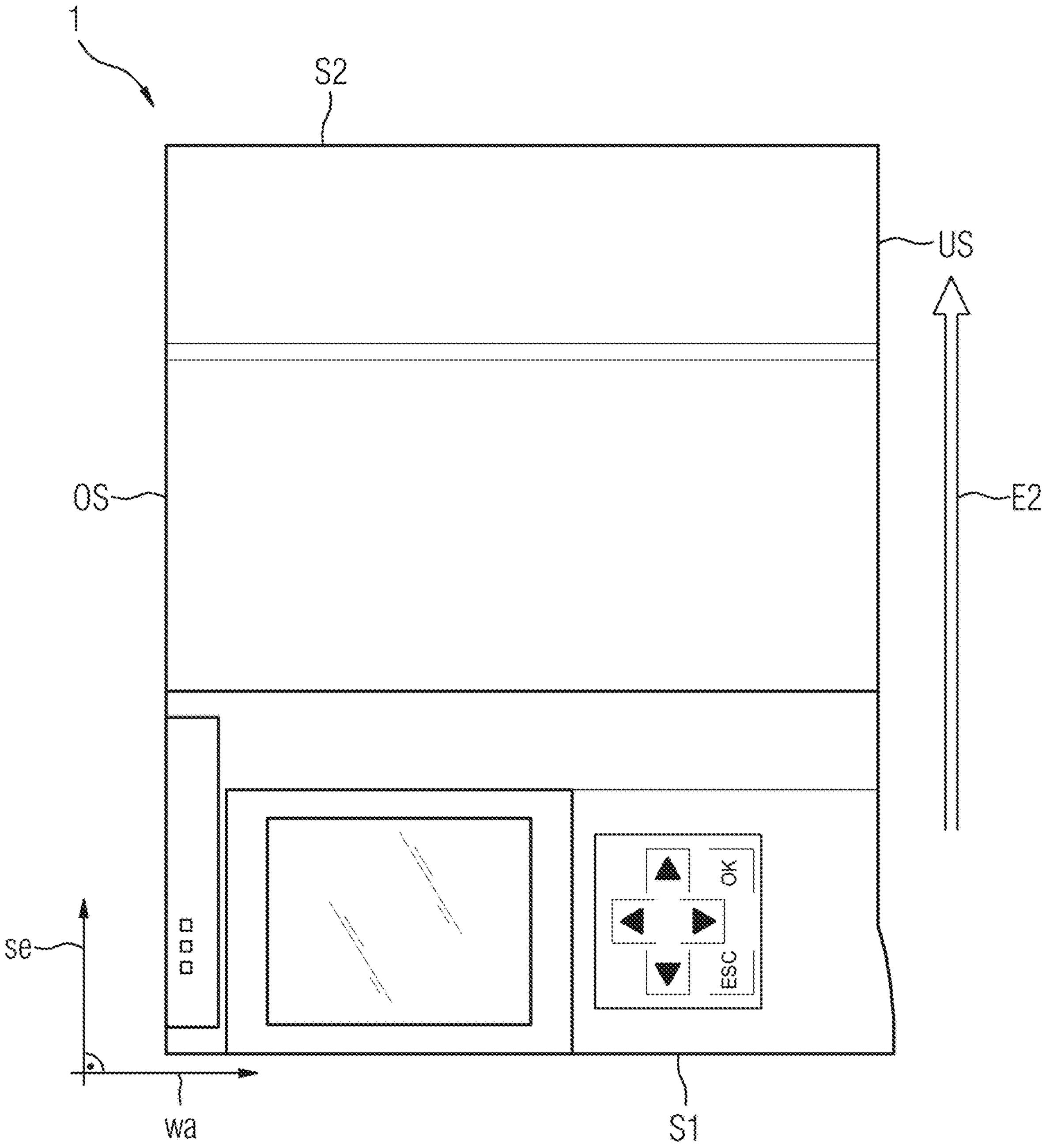
FIG. 3 is an illustration of the automation device of FIG. 2 in an installation position rotated by 90 degrees.

FIG. 3 shows the automation device 1 in a second installation position E2. Here, the side parts S1, S2 are aligned horizontally WA and the upper side OS and the underside US are aligned vertically SE.

Figure 4:
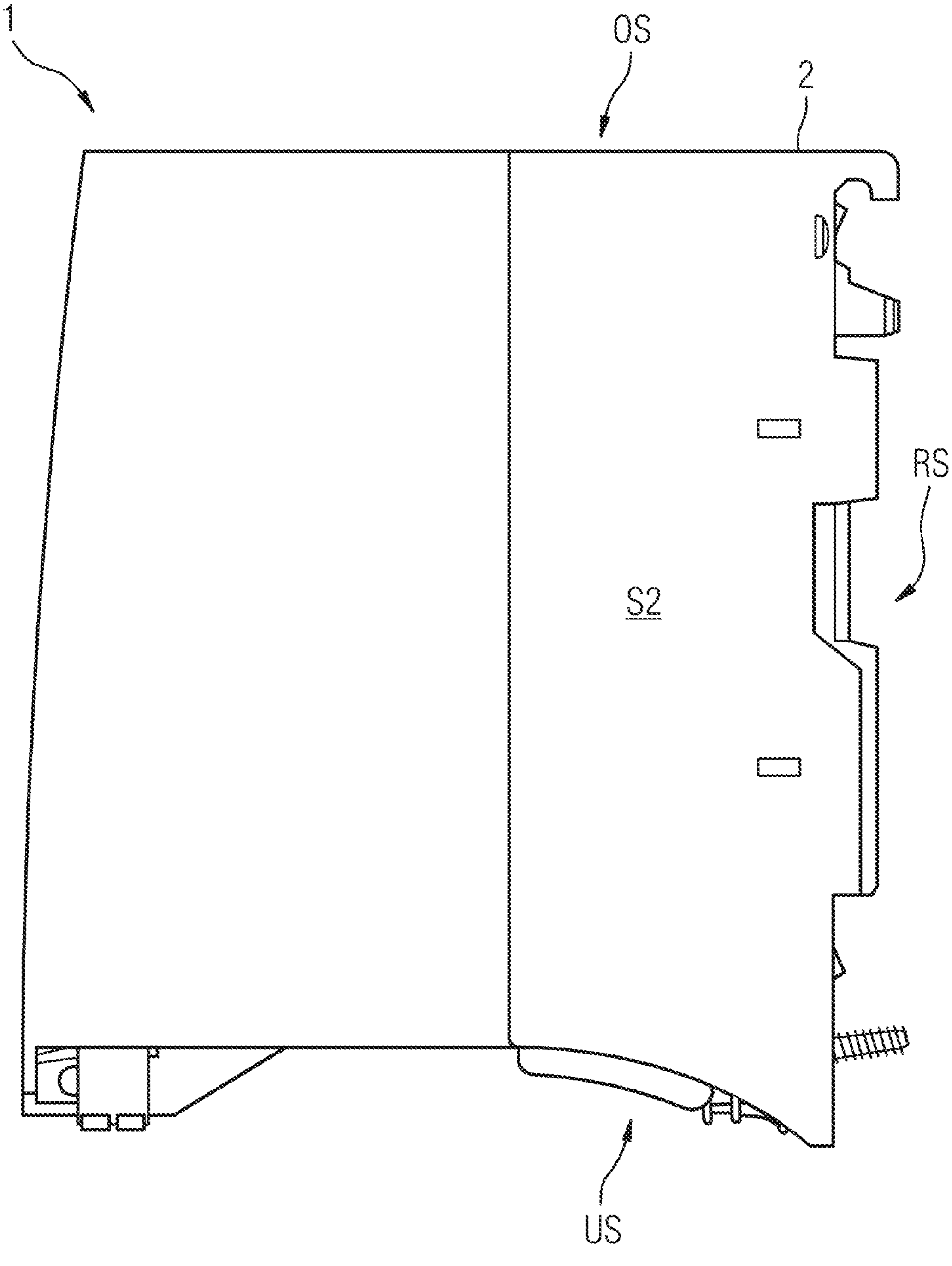
FIG. 4 is a side view of the automation device of FIG. 1.

FIG. 4 depicts the automation device 1 with a view of the second side part S2. The rear side RS is structure for mounting on a mount. Here, for example, there is a hook for hooking the automation device 1 onto a profile rail, there is a ground spring for establishing a ground contact to the profile rail and there is a screw for final fastening.

Figure 5:
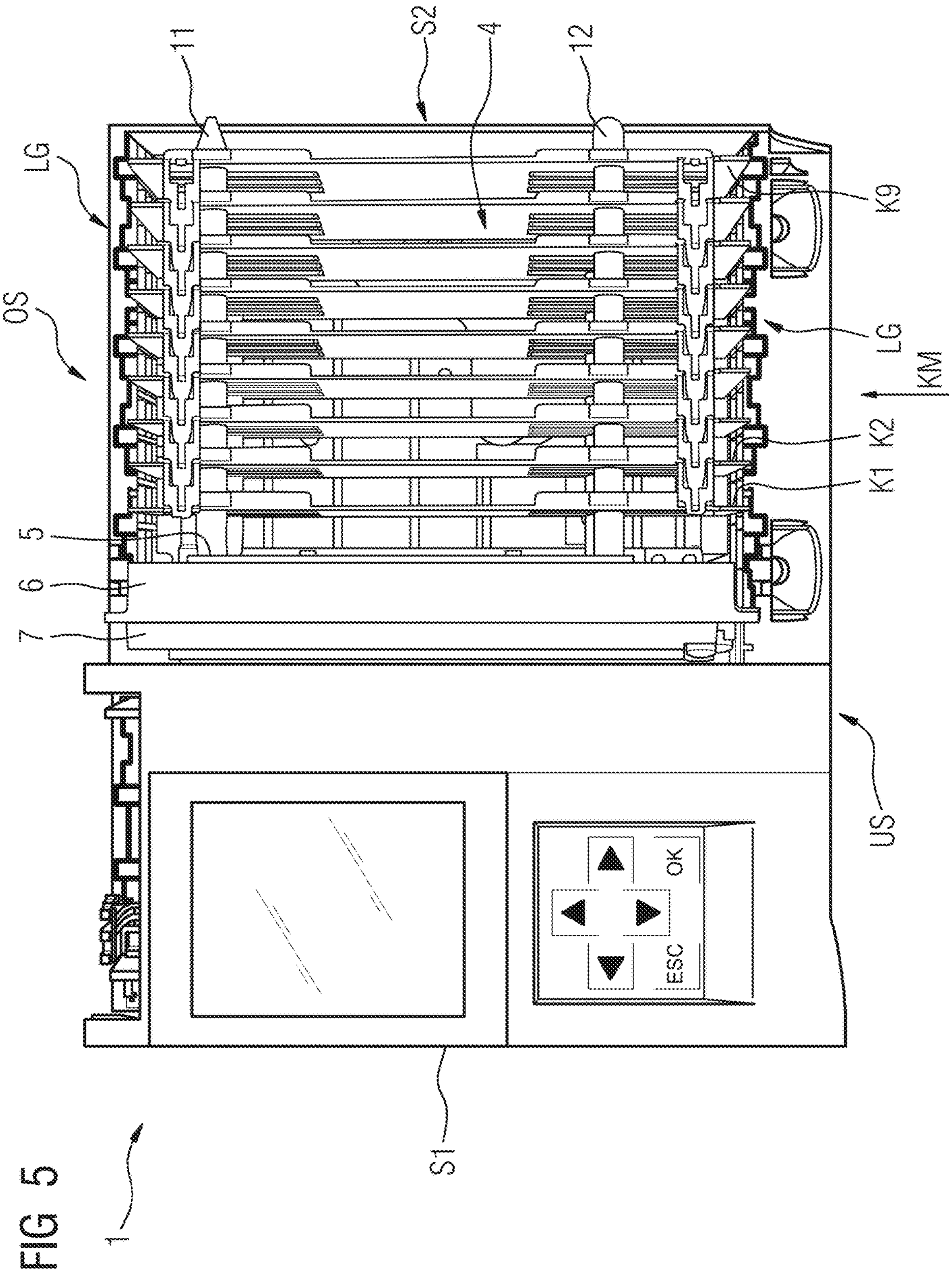
FIG. 5 is an illustration of the automation device of FIG. 1 with a partially opened enclosure with a view of a heat sink.

In FIG. 5, the automation device 1 has been partially freed of a front cover and there is a view of a heat sink 4. The heat sink 4 is in thermal connection with a microprocessor 3 arranged on a printed circuit board L. The heat sink 4 has a plurality of cooling metal sheets K1, . . . , K9. The cooling metal sheets K1, . . . , K9 are each arranged parallel to the printed circuit board L with a clearance between them and hence, for the first installation position E1 in which the underside US is aligned horizontally WA, it is possible for a cooling medium KM to flow from the underside US through the clearances and cool the automation device 1. A heat pipe lying directly on the microprocessor 3 is provided in the heat sink 4 for effective cooling of the cooling plate 5. The heat pipe comprises a first pipe 11 and a second pipe 12.

Figure 6:
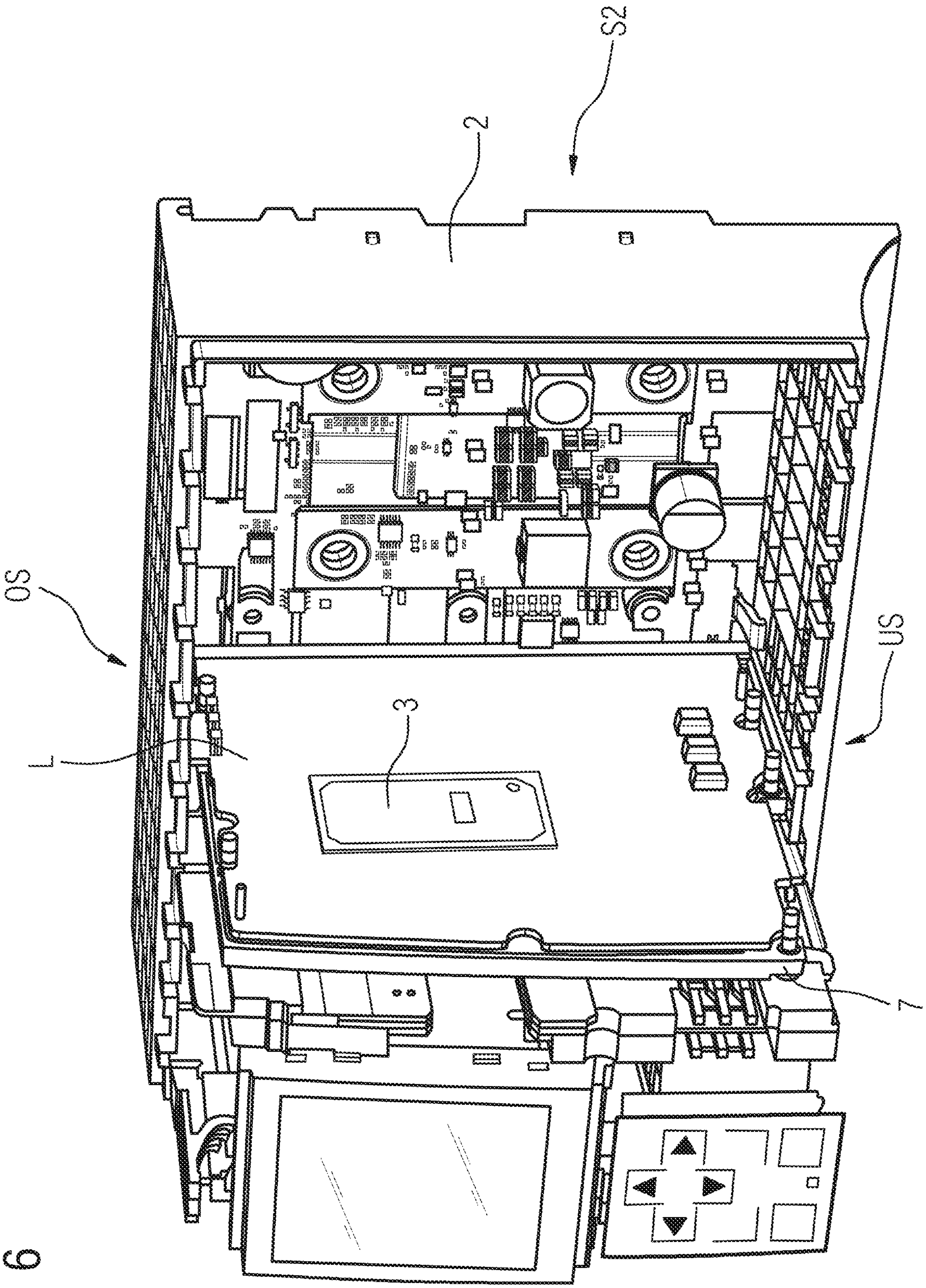
FIG. 6 an illustration of the automation device of FIG. 1 with a view of a printed circuit board and a microprocessor.

FIG. 6 shows the automation device 1 in a three-dimensional view with the heat sink 4 removed. This reveals a view of the printed circuit board L and the microprocessor 3 installed thereon. Previously, in conventional processors, the power loss was 5 to 12 watts. However, now new processors based on a 10 nm manufacturing process are to be used. These microprocessors achieve a significantly higher clock frequency and thus also a significantly higher power loss, which has to be effectively dissipated. For example, a new type of microprocessor 3 achieves a power loss of almost 50 watts in turbo frequency operation.

Figure 7:
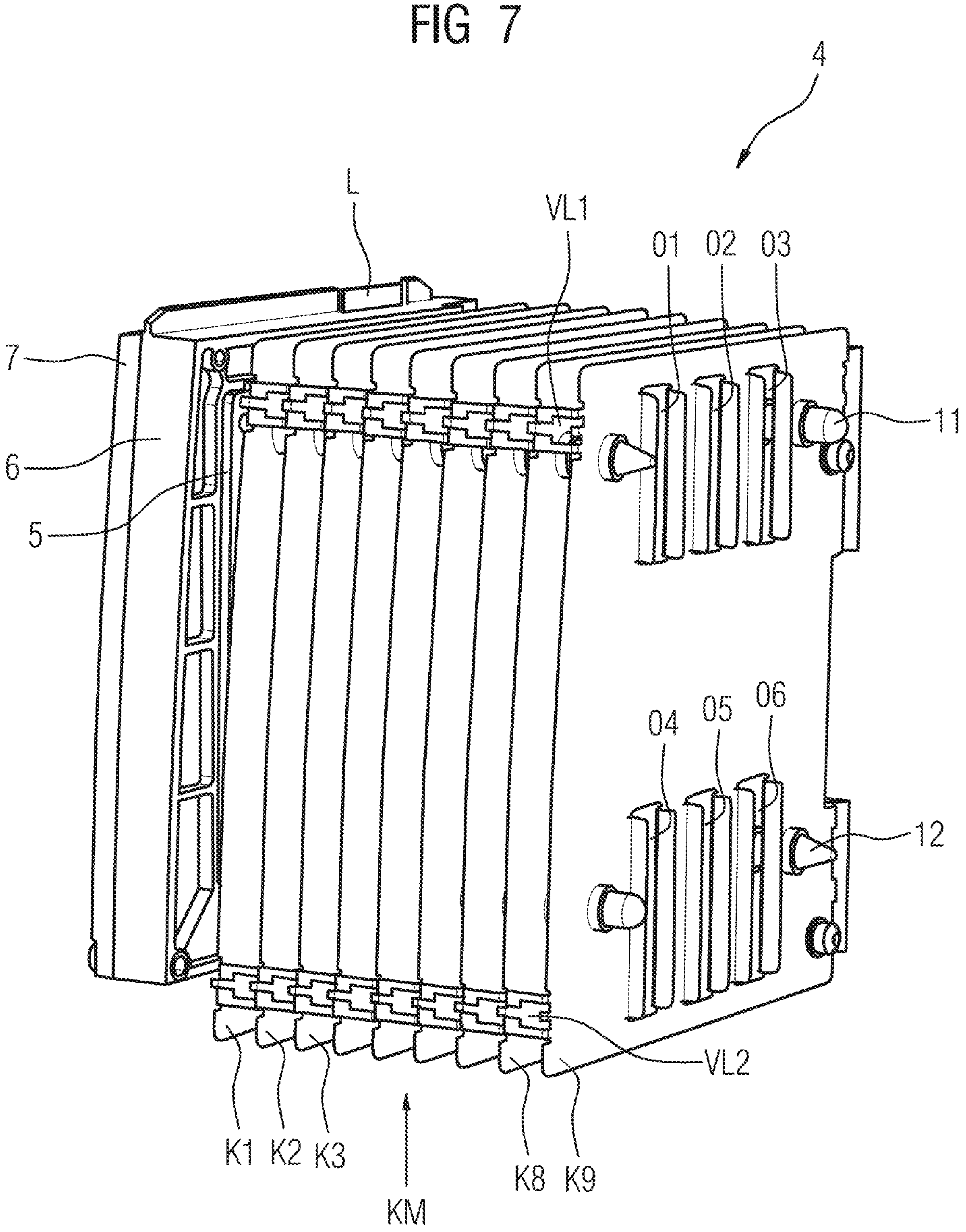
FIG. 7 is an illustration of a heat sink unit with a cooling metal sheet package in accordance with the invention.

FIG. 7 depicts the heat sink 4 in a three-dimensional view. The heat sink 4 is arranged on the cooling plate 5. The cooling plate 5 is in turn arranged directly on the microprocessor 3. A first pipe 11 and a second pipe 12 (see FIG. 9) are arranged in the cooling plate 5. The heat sink 4 comprises a plurality of cooling metal sheets K1, . . . , K9, which are each arranged parallel to the printed circuit board L with a clearance between them and, hence, it is possible for a cooling medium KM to flow from the underside US between the cooling metal sheets K1, . . . , K9. Openings O1, . . . , O6 are each arranged in the cooling metal sheets K1, . . . , K9 and, hence, it is possible, for a further second installation position E2 in which the underside US is aligned vertically, for the cooling medium KM to flow through the openings O1, . . . , O6 of the individual cooling metal sheets K1, . . . , K9 arranged one above the other. Using the example of the ninth cooling metal sheet K9, a first opening O1, a second opening O2 and a third opening O3 are arranged in a first row. A fourth opening O4, a fifth opening O5 and a sixth opening O6 are arranged in a second row. Each cooling metal sheet K1, . . . , K9 has these openings O1, . . . , O6, thus creating a chimney for a vertical installation position, i.e., the second installation position E2, which can dissipate the cooling medium KM upward through the openings O1, . . . , O6.

The cooling plate 5 is surrounded by a base support 6. A cover 7 is arranged on the base support 6 and the printed circuit board L is arranged between the base support 6 and the cover 7. A spring-mounted pressing structure 8 is arranged between the cover 7 and the printed circuit board L (see FIG. 11).

Figure 8:
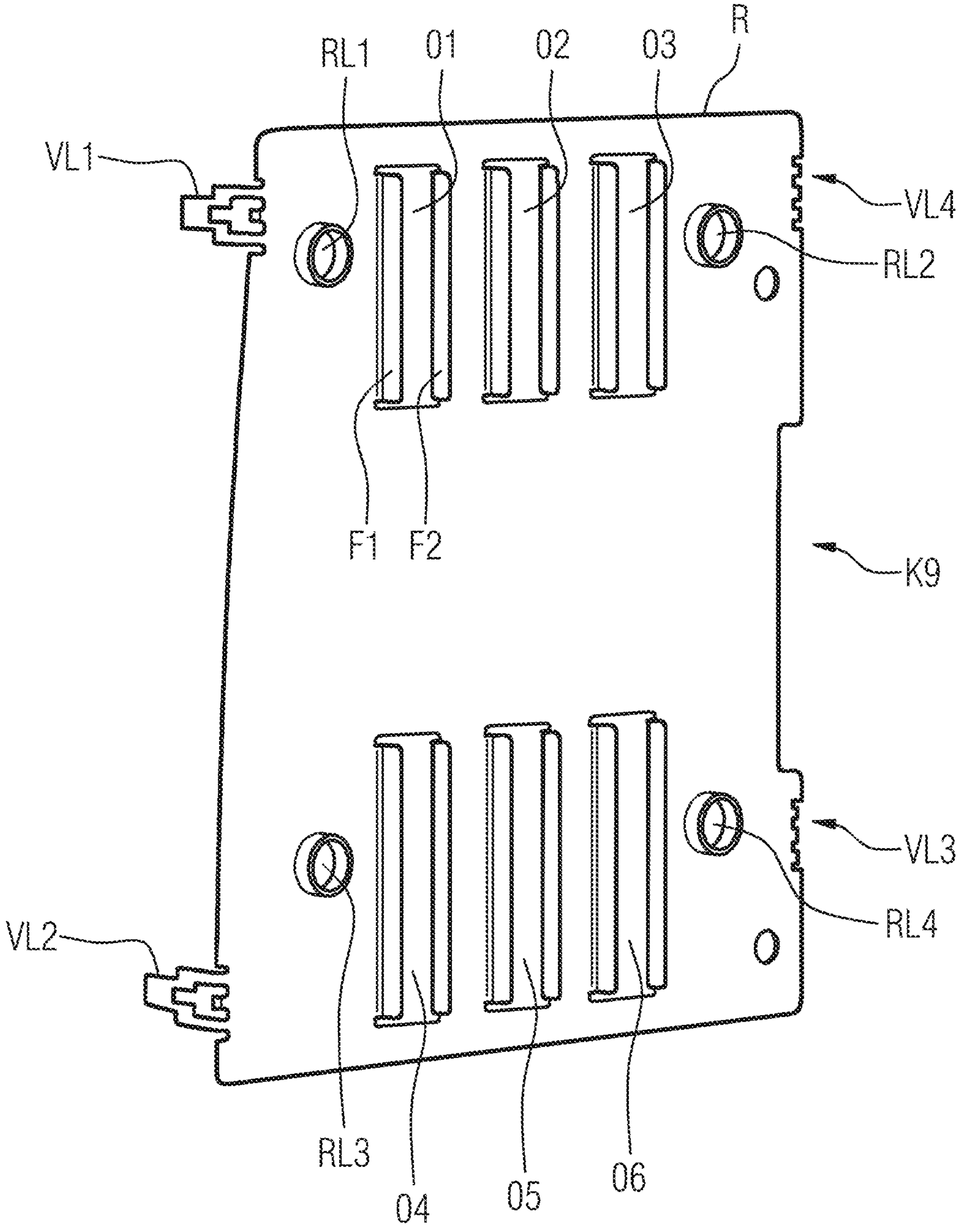
FIG. 8 is an illustration of a cooling metal sheet in accordance with the invention.

FIG. 8 depicts a single cooling metal sheet using the example of the ninth cooling metal sheet K9. The openings O1, . . . , O6 in the ninth cooling metal sheet K9 are bent out of the ninth cooling metal sheet K9 as a first vane F1 and a second vane F2. For stackable fastening of a plurality of cooling metal sheets K1, . . . , K9 one on top of the other, the ninth cooling metal sheet K9 has a first connecting tab VL1, a second connecting tab VL2, a third connecting tab VL3 and a fourth connecting tab VL4. The ninth cooling metal sheet K9 is formed as a sheet metal stamping made of aluminum and has the connecting tabs VL1, . . . , VL4 in the edge region on the edge R. For plugging onto the first pipe 11 or the second pipe 12, the cooling metal sheet K9 has a first pipe hole RL1, a second pipe hole RL2, a third pipe hole RL3 and a fourth pipe hole RL4.

The connecting tabs VL1, . . . , VL4 are explained in detail later with reference to FIGS. 14 and 15 where it will become clear how the configuration of the connecting tabs VL1, . . . , VL4 makes it possible to create a stackable firmly interconnected heat sink 4 out of the cooling metal sheets K1, . . . , K9.

Figure 9:
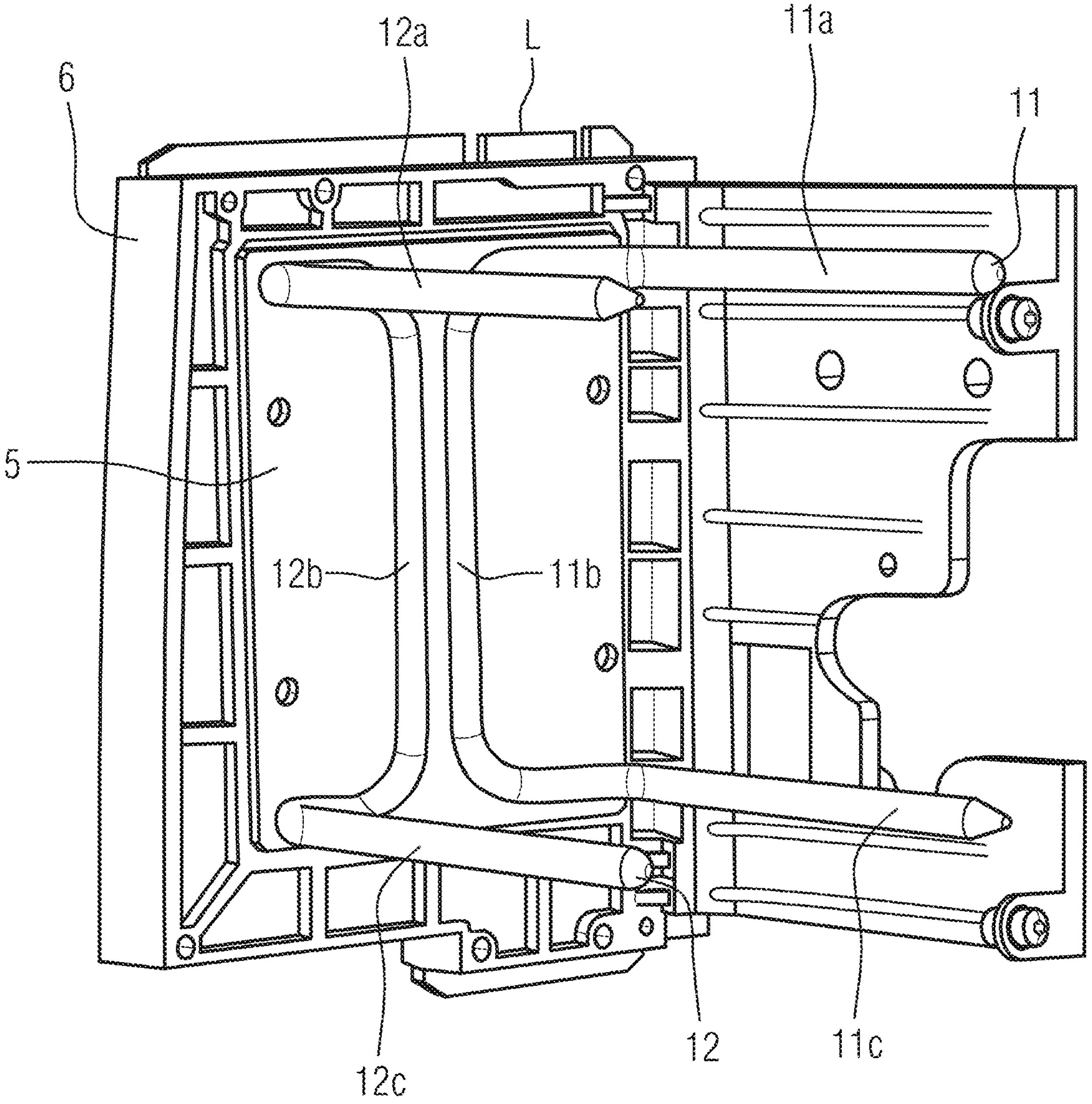
FIG. 9 is an illustration of a cooling unit with a view of a cooling plate and a depiction of heat pipes in accordance with the invention.

FIG. 9 illustrates the embedding of the first pipe 11 and the second pipe 12 in the cooling plate 5. The first pipe 11 and the second pipe 12 are embedded in the cooling plate 5 such that a first pipe section 11*a* of the first pipe 11 protrudes vertically from the cooling plate 5. A second pipe section 11*b* of the first pipe 11 is at least partially embedded in the cooling plate 5. A third pipe section 11*c* of the first pipe 11 in turn protrudes vertically from the cooling plate 5. The second pipe 12 is arranged likewise. A first pipe section 12*a* of the second pipe 12 protrudes vertically from the cooling plate 5, a second pipe section 12*b* of the second pipe 12 is at least partially embedded in the cooling plate 5. A third pipe section 12*c* of the second pipe 12 in turn protrudes vertically from the cooling plate 5. This arrangement of the first pipe 11 and the second pipe 12 enables the cooling metal sheets K1, . . . , K9 to be stacked on the vertically protruding pipe sections and connected to one another with the connecting tabs VL1, . . . , VL4 to form a heat sink package.

Figure 10:
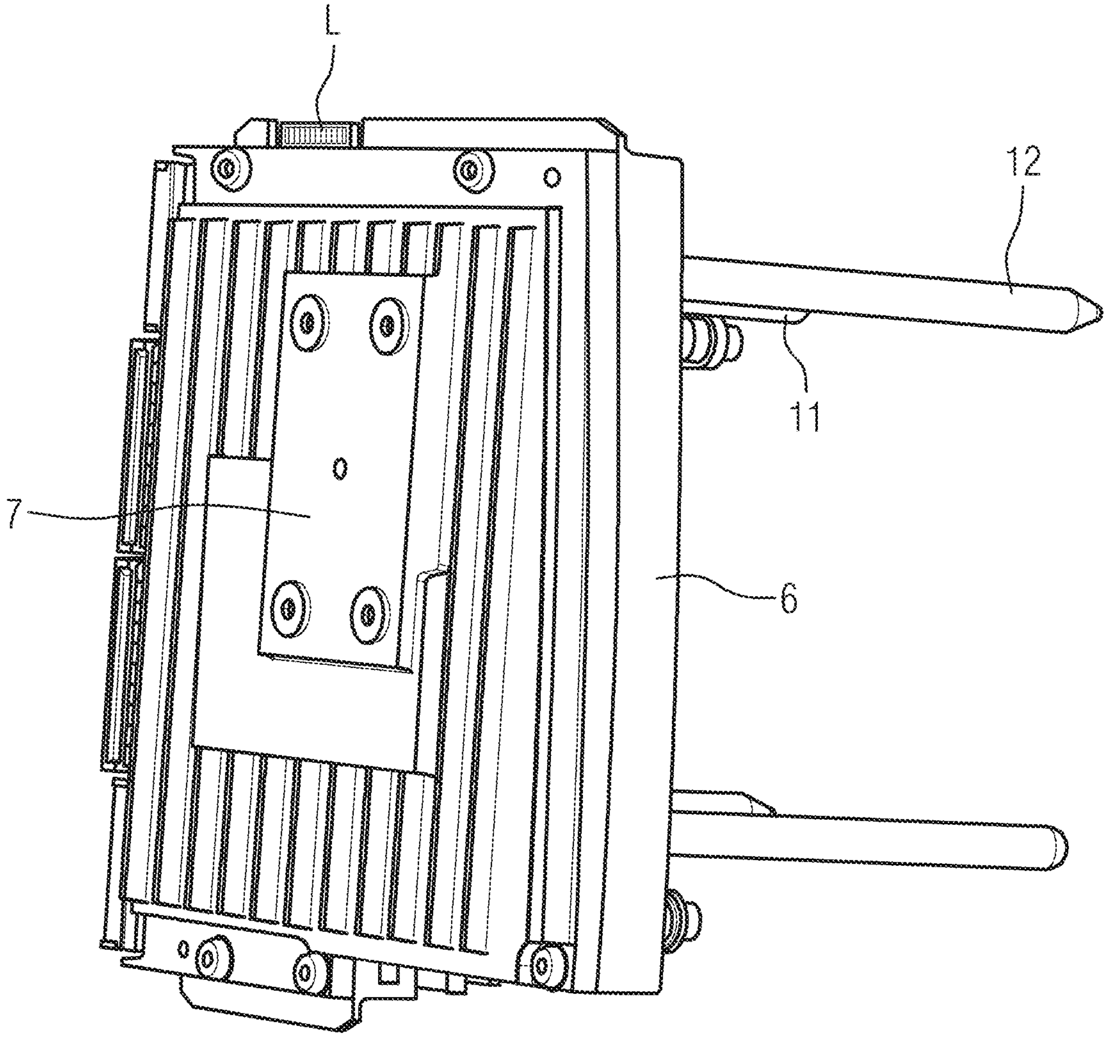
FIG. 10 is an illustration of the cooling unit of FIG. 9 in a rotated depiction with a view of a cover.

FIG. 10 shows the cover 7 screwed onto the base support 6. The spring-mounted pressing structure 8 is located under the pronounced elevation in the cover 7.

Figure 11:
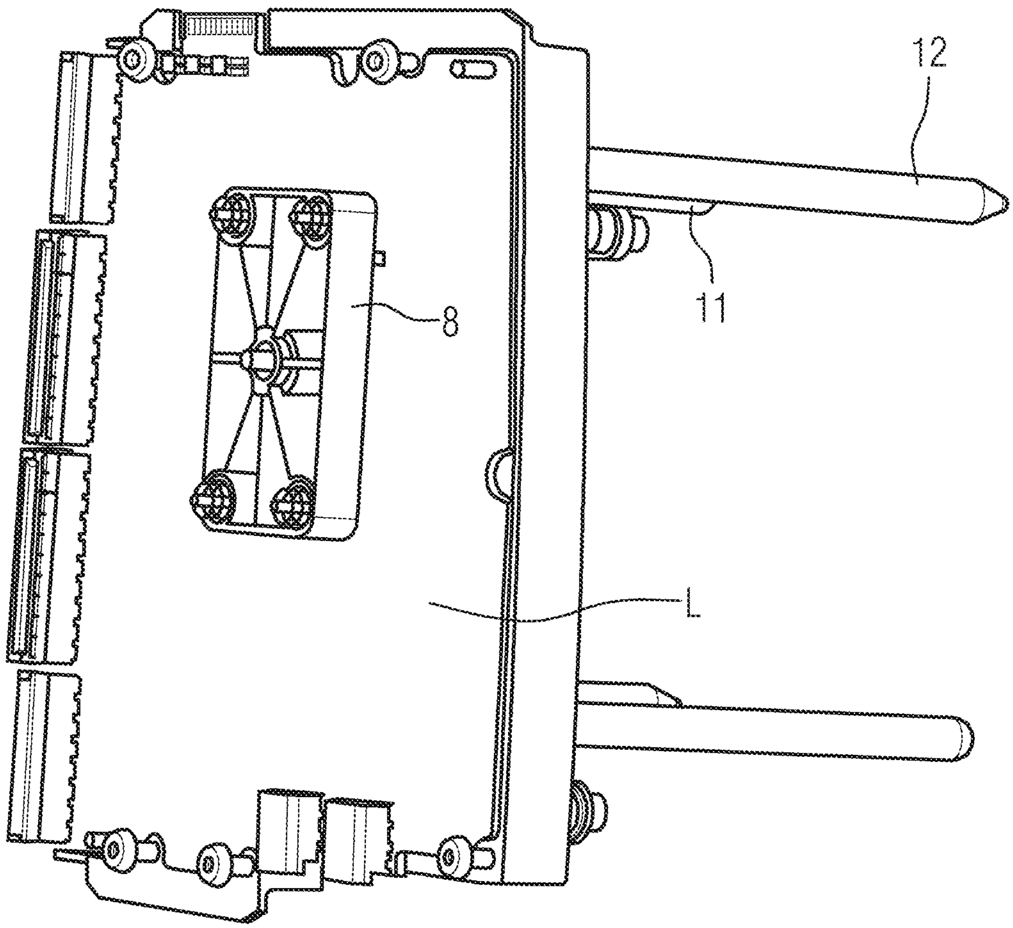
FIG. 11 is an illustration of the cooling unit of FIG. 9 with an open cover with a view of a pressure element.
Figure 12:
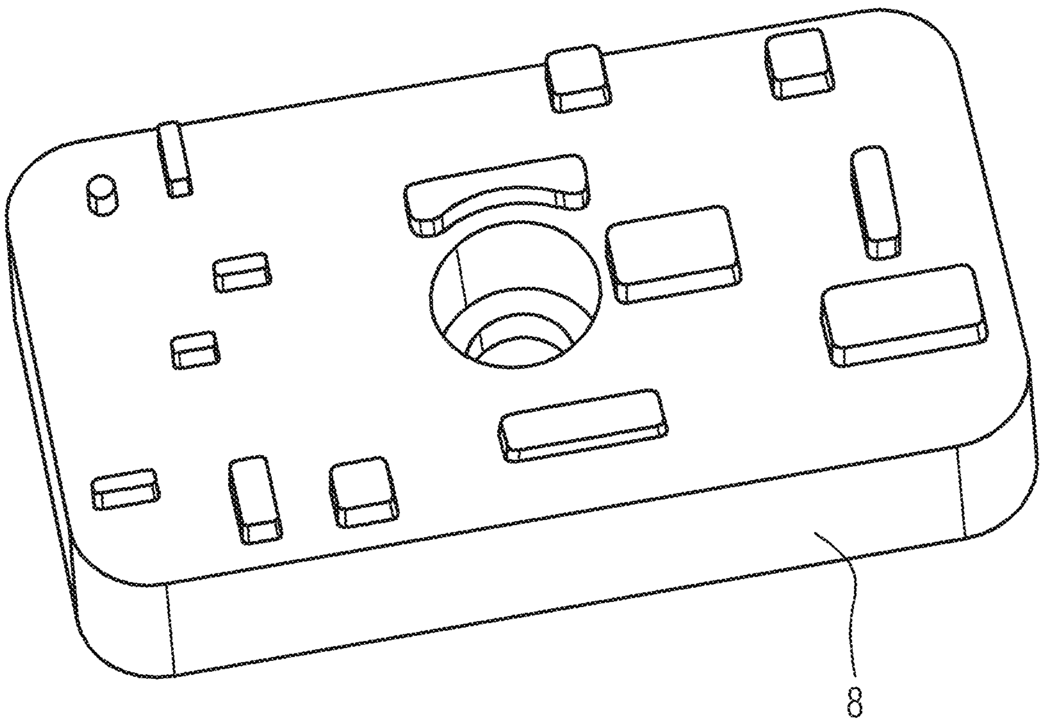
FIG. 12 is an illustration of a pressure element in accordance with the invention.

In FIG. 11, the cover 7 is open and the spring-mounted pressing structure 8 is visible. As illustrated in FIG. 12, the spring-mounted pressing structure 8 is spring-mounted in the cover 7 and configured to press the cooling plate 5 onto the printed circuit board via specifically arranged domes and webs in the spring-mounted pressing structure 8 so that the microprocessor 3 always has good or optimal contact with the cooling plate 5.

The spring-mounted pressing structure 8 is made of a plastic with the short name PEEK 10GF, polyether ether ketone with 10% fiber reinforcement. This material enables usage at continuous operating temperatures of up to 250-260° C.

The spring-mounted pressing structure 8 is formed as a pressure stamp with specifically arranged domes, which press directly into the gaps in the assembly onto the printed circuit board L. As a result, the printed circuit board L with the microprocessor 3 mounted on the opposite side of the printed circuit board L is pressed onto the cooling plate 5 of the heat pipe with a defined force of four pressure springs, without damaging any electronic components.

Figure 13B:
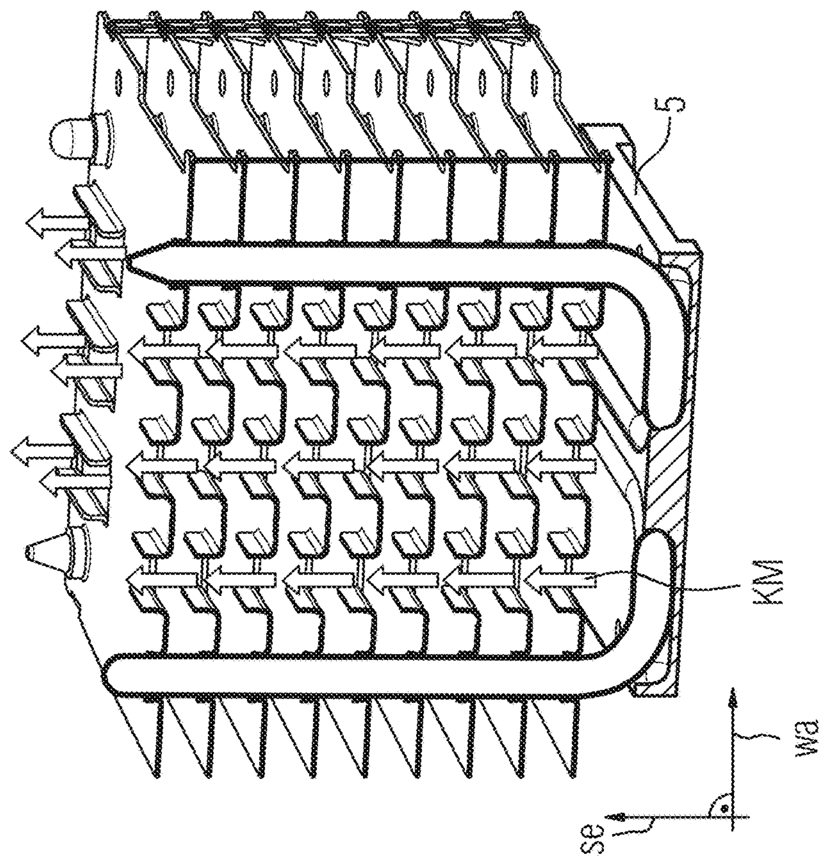
FIG. 13A and FIG. 13B are illustrations of the cooling metal sheet package for the automation device of FIG. 1, once in a horizontal installation position and once in a vertical installation position.

FIGS. 13A and 13B once again illustrate the principle of a heat sink 4 in accordance with the invention, which ensures sufficient cooling for a first installation position E1 and a second installation position E2 of the module.

Figure 13A:
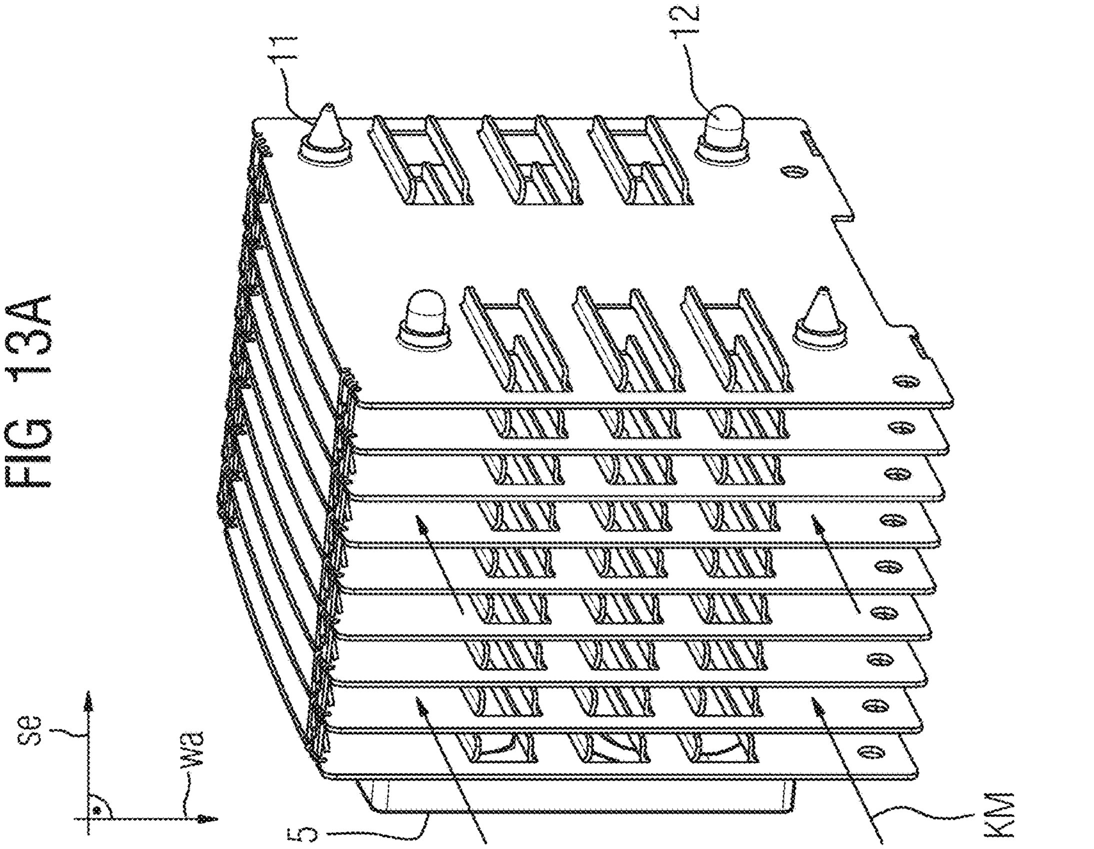

In FIG. 13A, in the first installation position E1, a cooling medium KM can flow through the clearances between the cooling metal sheets K1, . . . , K9. In the second installation position E2 shown in FIG. 13B, the cooling plate 5 is located in a horizontal WA position. It is now possible for the cooling medium KM to flow through the heat sink 4 through the openings O1, . . . , O6 arranged one above the other via a chimney effect. The additionally inserted guide sheets bent out of the cooling metal sheet K1, . . . , K9 as vanes F1, F2 can further improve the flow and this has the particular advantage that the surface area remains approximately the same size as with a non-stamped-out cooling metal sheet K1, . . . , K9.

Figure 14:
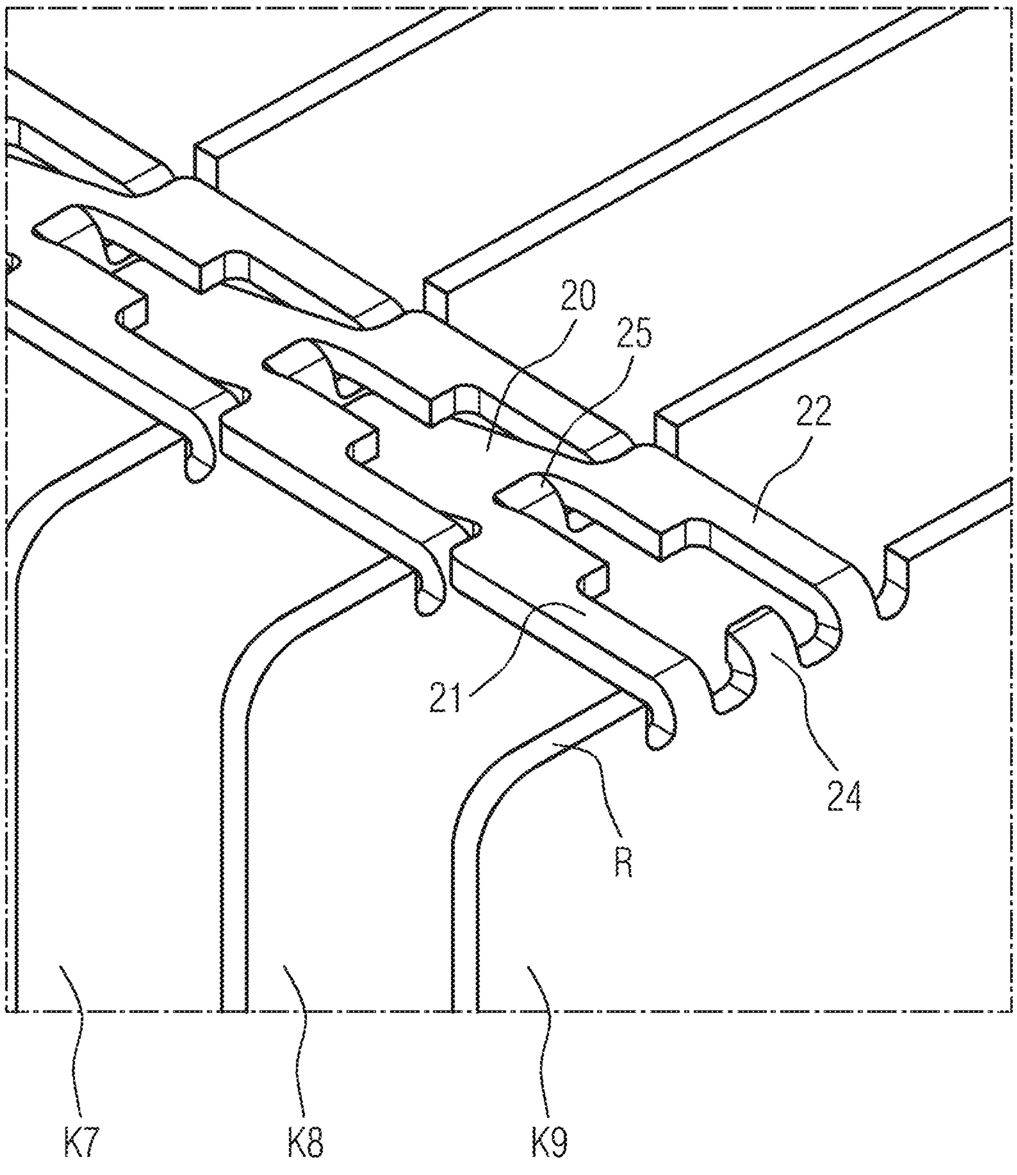
FIG. 14 is a detailed illustration of the cooling metal sheets with interlocking connecting tabs in accordance with the invention.
Figure 15:
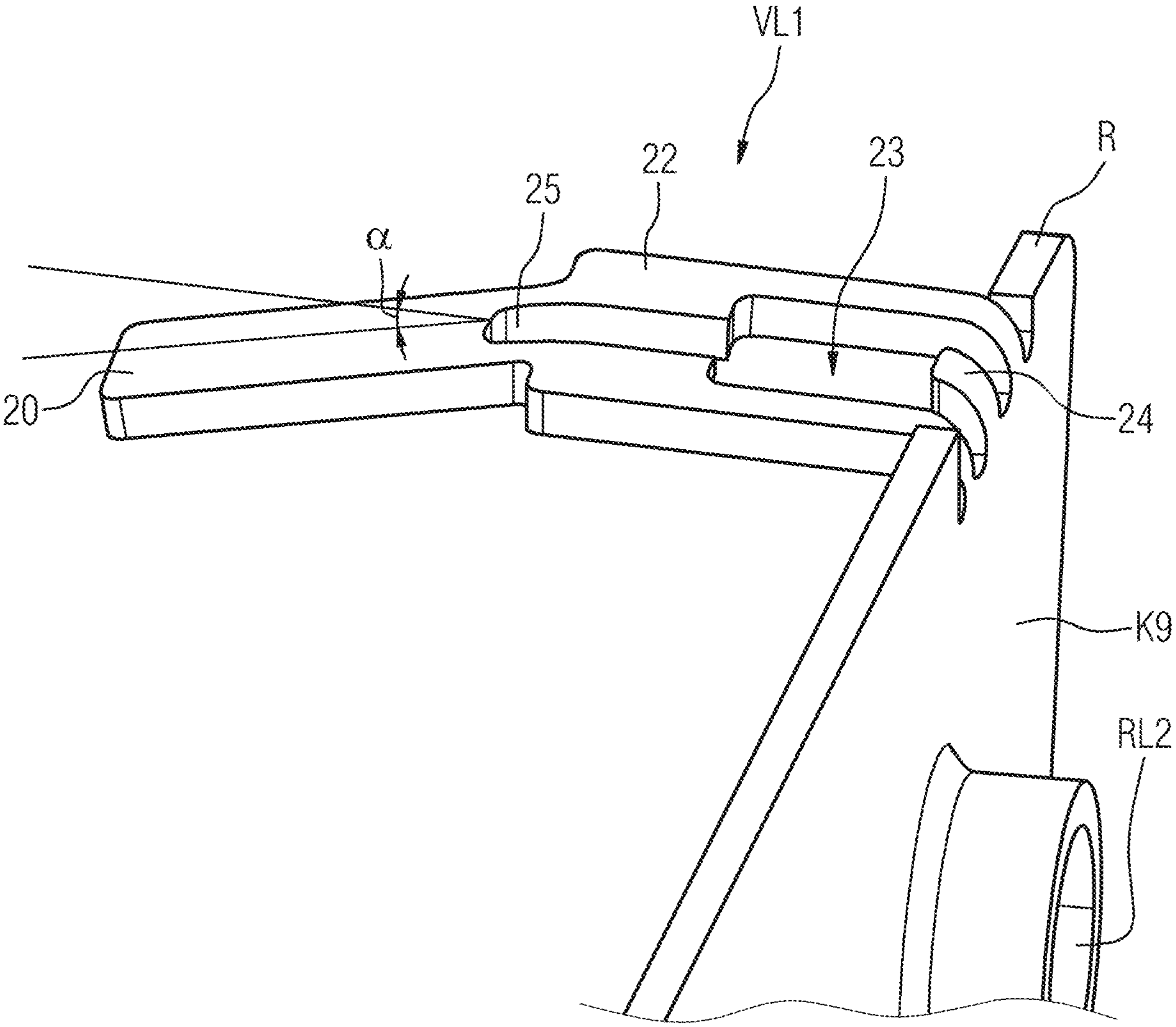
FIG. 15 is a detailed illustration of a connecting tab in accordance with the invention.

FIG. 14 and FIG. 15 show the configuration of the connecting tabs VL1, . . . , VL4. FIG. 14 depicts a detailed view of the heat sink 4. The seventh cooling metal sheet K7 is arranged under the eighth cooling metal sheet K8 and under the ninth cooling metal sheet K9. The connecting tabs VL1, . . . , VL4 are punched/stamped out of the sheet metal part in the edge region at the edge R of the ninth cooling metal sheet K9 such that the following arrangement results for a connecting tab VL1. A support part 20 is connected to a first limb 21 and a second limb 22. The first limb 21 and the second limb 22 are arranged at the edge R of the cooling metal sheet K1, . . . , K9. The first and second limb 21, 22 combine to form the support part 20. A recess is punched/stamped out between the first limb 21 and the second limb 22 in such a way that a pin 24 is arranged at the edge R. The counterpart for the pin 24 is additionally located through the recess 23, at the connection point of the first and second limb 21, 22 to the support part 20 a pin bearing 25 is located. A respective pin 24 of the sheet to be hooked engages in the pin bearing 25 of the cooling metal sheet K1, . . . , K9 located thereabove.

The support part 20 not only ensures better or greater strength, but it also defines the distance for the clearances between the cooling metal sheets K1, . . . , K9. The sheet metal part as a punched or stamped-out aluminum sheet is illustrated once again in FIG. 15. The punched-out or stamped-out connecting tab VL1 is bent almost at a right angle to the cooling metal sheet K9. Furthermore, the support part 20 is bent again by a bending angle α from the first limb 21 and the second limb 22. This ensures that the support part 20 rests securely on the cooling metal sheet 20 underneath. The second pipe hole L2 depicted is also punched or stamped out of the cooling metal sheet K9 with a stamped formation by a punching or stamping process. This type of punching or stamping makes it easier to glue, solder or press the first pipe 11 or the second pipe 12 in place later.

The connecting tabs VL1, . . . , VL4 depicted enable a heat sink 4 to be stacked as high as required and ensure that it always has sufficient strength and always maintains the same clearance.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements that perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An automation device configured for use in an automation environment for the automation of an industrial process, the automation device comprising:

a basic enclosure comprising a rear side an upper side, an underside, a first side part and a second side part which form a box shape, the rear side being structured for mounting on a mount;

a printed circuit board arranged parallel to the first side part and the second side part at right angles to the upper side or the underside, the printed circuit board carrying a microprocessor which is in thermal connection with a heat sink which includes cooling metal sheets;

wherein the heat sink includes a plurality of cooling metal sheets which are each arranged parallel to the printed circuit board with a clearance between them and such that, for a first installation position in which the underside is aligned horizontally, a cooling medium flows from the underside through each clearance; and wherein openings are arranged in each of the cooling metal sheets and such that, for a second installation position in which the underside is aligned vertically, the cooling medium flows through the openings arranged one above the other.

2. The automation device as claimed in claim 1, wherein the openings in the cooling metal sheet are bent out of each of the plurality of cooling metal sheets as vanes.

3. The automation device as claimed in claim 1, wherein the heat sink comprises a cooling plate which is arranged on the microprocessor, a pipe being embedded in the cooling plate such that a first pipe section protrudes vertically from the cooling plate, a second pipe section is at least partially embedded in the cooling plate and a third pipe section protrudes vertically from the cooling plate; and wherein each of the plurality of cooling metal sheets are arranged on the first pipe section and on the third pipe section parallel to the printed circuit board with a clearance between them.

4. The automation device as claimed in claim 2, wherein the heat sink comprises a cooling plate which is arranged on the microprocessor, a pipe being embedded in the cooling plate such that a first pipe section protrudes vertically from the cooling plate, a second pipe section is at least partially embedded in the cooling plate and a third pipe section protrudes vertically from the cooling plate; and wherein each of the plurality of cooling metal sheets are arranged on the first pipe section and on the third pipe section parallel to the printed circuit board with a clearance between them.

5. The automation device as claimed in claim 1, wherein the heat sink comprises a cooling plate, which is arranged on the microprocessor, a first pipe and a second pipe being embedded in the cooling plate such that a first pipe section of the first pipe protrudes vertically from the cooling plate, a second pipe section of the first pipe is at least partially embedded in the cooling plate and a third pipe section of the first pipe protrudes vertically from the cooling plate and that a first pipe section of the second pipe protrudes vertically from the cooling plate, a second pipe section of the second pipe is at least partially embedded in the cooling plate and a third pipe section of the second pipe protrudes vertically from the cooling plate; and wherein the plurality of cooling metal sheets are each arranged on the first pipe section and on the third pipe section of the respective first and second pipe parallel to the printed circuit board with a clearance between them.

6. The automation device as claimed in claim 2, wherein the heat sink comprises a cooling plate, which is arranged on the microprocessor, a first pipe and a second pipe being embedded in the cooling plate such that a first pipe section of the first pipe protrudes vertically from the cooling plate, a second pipe section of the first pipe is at least partially embedded in the cooling plate and a third pipe section of the first pipe protrudes vertically from the cooling plate and that a first pipe section of the second pipe protrudes vertically from the cooling plate, a second pipe section of the second pipe is at least partially embedded in the cooling plate and a third pipe section of the second pipe protrudes vertically from the cooling plate; and wherein the plurality of cooling metal sheets are each arranged on the first pipe section and on the third pipe section of the respective first and second pipe parallel to the printed circuit board with a clearance between them.

7. The automation device as claimed in claim 3, wherein the cooling plate is surrounded by a base support, a cover is arranged on the base support and the printed circuit board is arranged between the base support and the cover; and wherein a spring-mounted pressing structure is arranged between the cover and the printed circuit board.

8. The automation device as claimed in claim 5, wherein the cooling plate is surrounded by a base support, a cover is arranged on the base support and the printed circuit board is arranged between the base support and the cover; and wherein a spring-mounted pressing structure is arranged between the cover and the printed circuit board.

9. The automation device as claimed in claim 1, wherein the plurality of cooling metal sheets are formed as sheet metal stampings and connecting tabs are arranged in an edge region;

wherein a connecting tab comprises a support part, a first limb and a second limb, the first limb and the second limb being arranged at an edge of a cooling metal sheet of the plurality of cooling metal sheets;

wherein the first and second limbs are combined to form the support part, a recess being stamped out between the first limb and the second limb such that a pin is arranged on the edge; and wherein a pin bearing is additionally arranged through the recess at a connection point of the first and second limbs to the support part.

* * * * *